United States Patent
Park

(10) Patent No.: US 6,730,986 B2
(45) Date of Patent: May 4, 2004

(54) BIPOLAR JUNCTION TRANSISTORS HAVING TRENCH-BASED BASE ELECTRODES

(75) Inventor: Kang-Wook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/911,098

(22) Filed: Jul. 23, 2001

(65) Prior Publication Data

US 2001/0048134 A1 Dec. 6, 2001

Related U.S. Application Data

(62) Division of application No. 09/425,812, filed on Oct. 25, 1999, now Pat. No. 6,287,930.

(30) Foreign Application Priority Data

Nov. 7, 1998 (KR) .............................. 98-47656

(51) Int. Cl.⁷ ..................... H01L 27/082; H01L 27/102; H01L 29/70; H01L 31/11

(52) U.S. Cl. ...................................... 257/587

(58) Field of Search ................... 257/565, 566, 257/577, 578, 583, 584, 586, 587, 592, 593, 588; 438/369, 364, 320

(56) References Cited

U.S. PATENT DOCUMENTS

| | | | |
|---|---|---|---|
| 4,992,390 A | | 2/1991 | Chang .................. 438/270 |
| 4,996,581 A | * | 2/1991 | Hamasaki .................. 357/34 |

(List continued on next page.)

FOREIGN PATENT DOCUMENTS

| | | | |
|---|---|---|---|
| JP | 022990267 | 12/1990 | ................. 438/128 |
| JP | 406045342 A | * 2/1994 | |

OTHER PUBLICATIONS

Pruijmboom et al., *18 ps ECL–Gate Delay in Laterally Scaled 30 GHz Bipolar Transistors*, IEDM, 1994. pp. 825–828.

(List continued on next page.)

*Primary Examiner*—Long Pham
*Assistant Examiner*—Dana Farahani
(74) *Attorney, Agent, or Firm*—Myers Bigel Sibley & Sajvoec

(57) ABSTRACT

Bipolar junction transistors utilize trench-based base electrodes and lateral base electrode extensions to facilitate the use of preferred self-alignment processing techniques. A bipolar junction transistor is provided that includes an intrinsic collector region of first conductivity type in a semiconductor substrate. A trench is also provided in the substrate. This trench extends adjacent the intrinsic collector region. A base electrode of second conductivity type is provided in the trench and a base region of second conductivity type is provided in the intrinsic collector region. This base region is self-aligned to the base electrode and forms a P-N rectifying junction with the intrinsic collector region. An emitter region of first conductivity type is also provided in the base region and forms a P-N rectifying junction therewith. To reduce lateral dimensions and reliance on critical photolithographically defined masking steps, the base electrode is formed to have a lateral base electrode extension that extends along a surface of the substrate. When formed, both the base region and emitter region are self-aligned to the base electrode extension. A trench insulating layer is also disposed in the trench, between the base electrode and the intrinsic collector region. The base region is also configured as an extrinsic base region of second conductivity type that is self-aligned to the base electrode and an intrinsic base region of second conductivity type that is self-aligned to a sidewall of the base electrode extension. The emitter region is also preferably self-aligned to the sidewall of the base electrode extension.

7 Claims, 7 Drawing Sheets

U.S. PATENT DOCUMENTS

| | | | |
|---|---|---|---|
| 5,003,365 A | | 3/1991 | Havemann et al. .......... 257/514 |
| 5,086,005 A | * | 2/1992 | Hirakawa ..................... 437/32 |
| 5,279,976 A | | 1/1994 | Hayden et al. ............. 438/350 |
| 5,286,996 A | | 2/1994 | Neudeck et al. ............ 257/586 |
| 5,336,632 A | | 8/1994 | Imamura ..................... 438/329 |
| 5,374,846 A | | 12/1994 | Takemura et al. .......... 257/592 |
| 5,382,828 A | | 1/1995 | Neudeck et al. ............ 257/586 |
| 5,434,092 A | | 7/1995 | Neudeck et al. .............. 437/34 |
| 5,481,126 A | | 1/1996 | Subramanian et al. ...... 257/273 |
| 5,496,745 A | | 3/1996 | Ryum et al. ................ 438/359 |
| 5,506,157 A | * | 4/1996 | Lee et al. ..................... 437/31 |
| 5,627,395 A | | 5/1997 | Witek et al. ................ 257/350 |
| 5,643,810 A | | 7/1997 | Jang ............................. 437/31 |
| 5,686,345 A | | 11/1997 | Harmon et al. ............. 438/702 |
| 5,717,227 A | | 2/1998 | Kim ........................... 257/139 |
| 5,721,147 A | | 2/1998 | Yoon ........................... 437/31 |
| 5,804,476 A | | 9/1998 | Jang ........................... 438/202 |
| 5,811,871 A | | 9/1998 | Nakashima ................. 257/565 |
| 5,814,538 A | | 9/1998 | Kim et al. ................... 438/153 |
| 5,841,150 A | | 11/1998 | Gonzalez et al. .............. 257/3 |
| 5,869,881 A | | 2/1999 | Lee et al. .................... 257/586 |
| 5,897,359 A | | 4/1999 | Cho et al. ................... 438/312 |
| 6,030,882 A | | 2/2000 | Hong .......................... 438/433 |
| 6,074,954 A | | 6/2000 | Lill et al. .................... 438/710 |

OTHER PUBLICATIONS

Uchino, *15–ps ECL/74–GHz $f_r$ Si Bipolar Technology*, IEDM, 1993, pp. 67–70.

Ugajin et al., *Very–High $f_t$ and $f_{max}$ Silicon Bipolar Transistors Using Ultra–High–Performance Super Self–Aligned Process Technology for Low–Energy and Ultra–High–Speed LSI's*, IEDM, 1995, pp. 735–738.

Wolf, S., Silicon Processing for the VLSI Era vol. 2: Process Integration, Sunset Beach, CA, 1990, pp. 52, 510–512.

Yamaguchi et al., *0.5–μm Bipolar Technology Using a New Base Formation Method: SSTIC*, IEEE 1993 Bipolar Circuits and Technology Meeting 4.2. 1993, pp. 63–66.

Yoshino et al., *A 62.8 GHz fmax LP–CVD Epitaxially Grown Silicon Base Bipolar Transistor With Extremely High Early Voltage of 85.7V*, Symposium on VLSI Technology Digest of Technical Papers, 1995, pp. 131–132.

* cited by examiner

BIPOLAR JUNCTION TRANSISTORS HAVING TRENCH-BASED BASE ELECTRODES

RELATED APPLICATION

This application is a divisional of U.S. patent application Ser. No. 09/425,812, filed Oct. 25, 1999, now U.S. Pat. No. 6,287,930, the disclosure of which is hereby incorporated herein by reference.

This application is related to Korean Application No. 98-47656, filed Nov. 7, 1998, the disclosure of which is hereby incorporated herein by reference.

Field of the Invention

The present invention relates to integrated circuit devices and methods of forming integrated circuit devices, and more particularly to bipolar junction transistors and methods of forming bipolar junction transistors.

BACKGROUND OF THE INVENTION

Attempts to develop bipolar junction transistors (BJTs) having higher operating speeds than conventional silicon-based bipolar junction transistors have led to the development of GaAs-based BJTs and heterojunction bipolar junction transistors (HBTs). However, the use of materials such as GaAs and the formation of HBT devices typically increases the complexity and cost of fabricating BJTs.

To address these limitations associated with GaAs-based BJTs and HBTs, continuing attempts have been made to develop silicon-based BJTs having improved electrical characteristics (e.g., higher operating speeds). For example, as described in U.S. Pat. No. 5,286,996 to Neudeck et al., entitled "Triple Self-Aligned Bipolar Junction Transistor", self-alignment techniques have been developed to reduce fabrication complexity and reduce reliance on critical photolithographically defined masking and patterning steps. Recent attempts to develop self-aligned BJTs have also included the design of vertical and lateral scaling and base resistance reduction techniques. For example, a vertical scaling technique is disclosed in an article by Takashi Uchino et al., entitled "15-ps ECL/74-GHz $f_T$ Si Bipolar Technology", IEDM Technical Digest, pp. 67–70 (1993). A lateral scaling technique is also disclosed in an article by A. Pruijmboom et al., entitled "18ps ECL-Gate Delay in Laterally Scaled 30 Ghz Bipolar Transistor", IEDM Technical Digest, pp. 825–828 (1994). A base resistance reduction technique is disclosed in an article by C. Yoshino et al., entitled "A 62.8 GHz $f_{max}$ LP-CVD Epitaxially Grown Silicon Base Bipolar Transistor with Extremely High Early Voltage of 85.7V", 1995 Symposium on VLSI Technology, Technical Digest, pp. 131–132 (1995). Unfortunately, the techniques disclosed in these articles may not be useful in developing BJTs having both high cutoff frequency $f_T$ and high maximum oscillating frequency $f_{max}$.

In order to simultaneously improve the cutoff frequency and the maximum oscillating frequency of a BJT, it may be necessary to optimize the diffusion profile of extrinsic base region dopants diffused from a polysilicon base electrode. For example, if the extrinsic base region dopants are diffused to define a large extrinsic base region, the base-collector junction capacitance may increase and limit the cutoff frequency. However, if the extrinsic base region dopants are diffused to define a small extrinsic base region, the base resistance may increase to a level that is too high.

Other techniques for forming BJTs are disclosed in an article by Mamoru Ugajin et al., entitled "Very-High $f_T$ and $f_{max}$ Silicon Bipolar Transistors Using Ultra-High-Performance Super Self-Aligned Process Technology for Low-Energy and Ultra-High-Speed LSI's", IEDM Technical Digest, pp. 735–738, (1995). In this article, emphasis is placed on reducing lateral dimensions in order to reduce base-collector junction capacitance and base resistance and increase $f_T$. The $f_{max}$ of the BJT disclosed in this article was also reported as being twice as large as the $f_{max}$ disclosed in an article by Chikara Yamaguchi et al., entitled "0.5-um Bipolar Technology Using a New Base Formation Method: SST1C", IEEE Proceedings of the Bipolar Circuits and Technology Meeting, pp. 63–66, (1993).

FIGS. 1–2 illustrate a conventional bipolar junction transistor, as described in the aforementioned Ugajin et al. article. In particular, FIGS. 1–2 illustrate a bipolar junction transistor having an N+ epitaxial intrinsic collector region 13 that is formed on a buried extrinsic collector layer 11 within a P-type substrate 10. Field oxide isolation regions 15 are also formed in the substrate 10, as illustrated. Electrical isolation is also provided by a plurality of trench-based isolation regions that include an oxide layer 19 lining the trenches 17 and highly-doped channel-stop regions 18 at the bottoms of the trenches. The trench-based isolation regions also include polysilicon regions 21 that act as floating field rings. An N+ polysilicon collector contact 33 is also provided on the buried layer 11 and P+ polysilicon base electrodes 23 are provided on the field oxide isolation regions 15. The illustrated bipolar junction transistor also includes first and second interlayer insulating layers 25 and 37, an emitter electrode 31, intermediate emitter, base and collector contacts 51, 53 and 55 (which may comprise tungsten) and emitter, base and collector wiring layers 52, 54 and 56.

Referring now to FIG. 2, region A within FIG. 1 is illustrated in greater detail. As illustrated by FIG. 2, the bipolar junction transistor also includes an emitter region 41, an intrinsic base region 43 and an extrinsic base region 42. The extrinsic base region 42 may be formed as a self-aligned region by diffusing dopants from the polysilicon base electrode 23 into the intrinsic collector region 13. As illustrated, the width of the extrinsic base region 42 may be dependent on the width W2 of the contact formed between the polysilicon base electrode 23 and the intrinsic collector region 13. The first interlayer insulating layer 25 may comprise silicon nitride and sidewall spacers 29 may be formed on sidewalls of the polysilicon base electrode 23, as illustrated. The polysilicon emitter electrode 31 may also be formed in the opening 27 (having a width W1) between the sidewall spacers 29. Emitter region dopants can also be diffused from the emitter electrode 31 into the intrinsic base region 43, to define a self-aligned emitter region 41. Unfortunately, because the patterning of the polysilicon base electrodes 23 typically requires a critical photolithographically defined masking and patterning step, the width of the opening W1 and therefore the width of the intrinsic base region 43 and emitter region 41 may be relatively large. Such large dimensions may result in relatively large parasitic capacitance and may limit integration and the maximum oscillating frequency $f_{max}$.

Thus, notwithstanding the above-described bipolar junction transistors and methods of forming bipolar junction transistors, there continues to be a need for more highly integrated bipolar junction transistors having improved electrical characteristics.

SUMMARY OF THE INVENTION

It is therefore an object of the present invention to provide bipolar junction transistors having improved electrical characteristics and improved methods of forming bipolar junction transistors.

It is another object of the present invention to provide highly integrated bipolar junction transistors and methods of forming highly integrated bipolar junction transistors.

It is still another object of the present invention to provide methods of forming bipolar junction transistors that utilize self-alignment techniques to more accurately control the dimensions of critical regions within the transistor.

These and other objects, advantages and features of the present invention are provided by bipolar junction transistors that utilize trench-based base electrodes and lateral base electrode extensions to facilitate the use of preferred self-alignment processing techniques. According to one embodiment of the present invention, a bipolar junction transistor is provided that includes an intrinsic collector region of first conductivity type (e.g., N-type) in a semiconductor substrate. A trench (e.g., ring-shaped trench) is also provided in the substrate. This trench extends adjacent the intrinsic collector region. According to a preferred aspect of the present invention, a base electrode of second conductivity type (e.g., P-type) is provided in the trench and a base region of second conductivity type is provided in the intrinsic collector region. This base region is self-aligned to the base electrode and forms a P-N rectifying junction with the intrinsic collector region. An emitter region of first conductivity type is also provided in the base region and forms a P-N rectifying junction therewith. To reduce lateral dimensions and reliance on critical photolithographically defined masking steps, the base electrode is formed to have a lateral base electrode extension that extends along a surface of the substrate. When formed, both the base region and emitter region are self-aligned to the base electrode extension. A trench insulating layer is also disposed in the trench, between the base electrode and the intrinsic collector region. The base region is also configured as an extrinsic base region of second conductivity type that is self-aligned to the base electrode and an intrinsic base region of second conductivity type that is self-aligned to a sidewall of the base electrode extension. The emitter region is also preferably self-aligned to the sidewall of the base electrode extension.

According to another embodiment of the present invention, preferred methods of forming bipolar junction transistors include the steps of forming a trench in a semiconductor substrate having an intrinsic collector region of first conductivity type therein and then forming a base electrode of second conductivity type in the trench. A base region of second conductivity type and an emitter region of first conductivity type are both formed in the intrinsic collector region in a self-aligned manner. In particular, the preferred self-alignment technique utilizes steps of forming an electrically insulating masking layer as a composite of a nitride layer and an oxide layer, on the semiconductor substrate, and then etching the semiconductor substrate to define the trench, using the electrically insulating masking layer as an etching mask. After the trench has been formed, the nitride layer (or oxide layer) is selectively etched to define a lateral recess within the electrically insulating masking layer. The base electrode is then formed by depositing a layer of polysilicon of second conductivity type in the trench and in the lateral recess. Dopants of second conductivity type are then diffused from the base electrode into the intrinsic collector region, to define an extrinsic base region therein. Based on this sequence of steps, the extrinsic base region becomes self-aligned to the lateral recess within the electrically insulating masking layer and the dimensions of this lateral recess can be defined by carefully controlled etching techniques instead of critical photolithographic alignment techniques. The emitter region is also self-aligned to the base electrode. The emitter region is preferably formed by etching the electrically insulating masking layer, using the base electrode as an etching mask and then forming an electrically insulating sidewall spacer on a sidewall of the base electrode. A polysilicon emitter electrode of first conductivity type is then formed on the electrically insulating sidewall spacer. Dopants of first conductivity type are then diffused from the polysilicon emitter electrode into the intrinsic collector region to define the emitter region.

DESCRIPTION OF PREFERRED EMBODIMENTS

Figure 1:
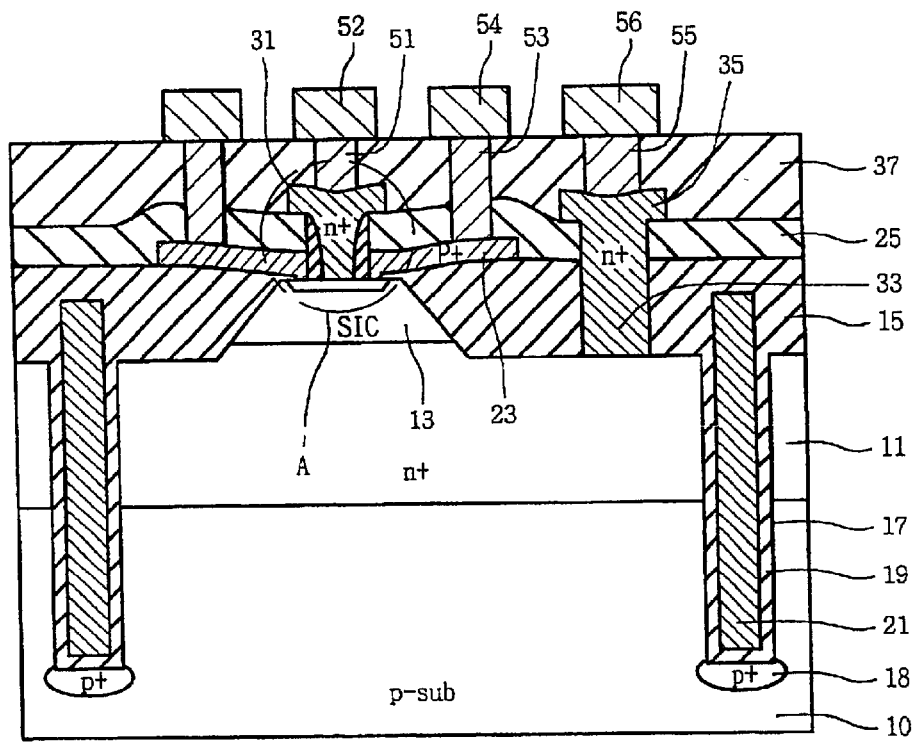
FIG. 1 is a cross-sectional view of an integrated circuit bipolar junction transistor according to the prior art.
Figure 2:
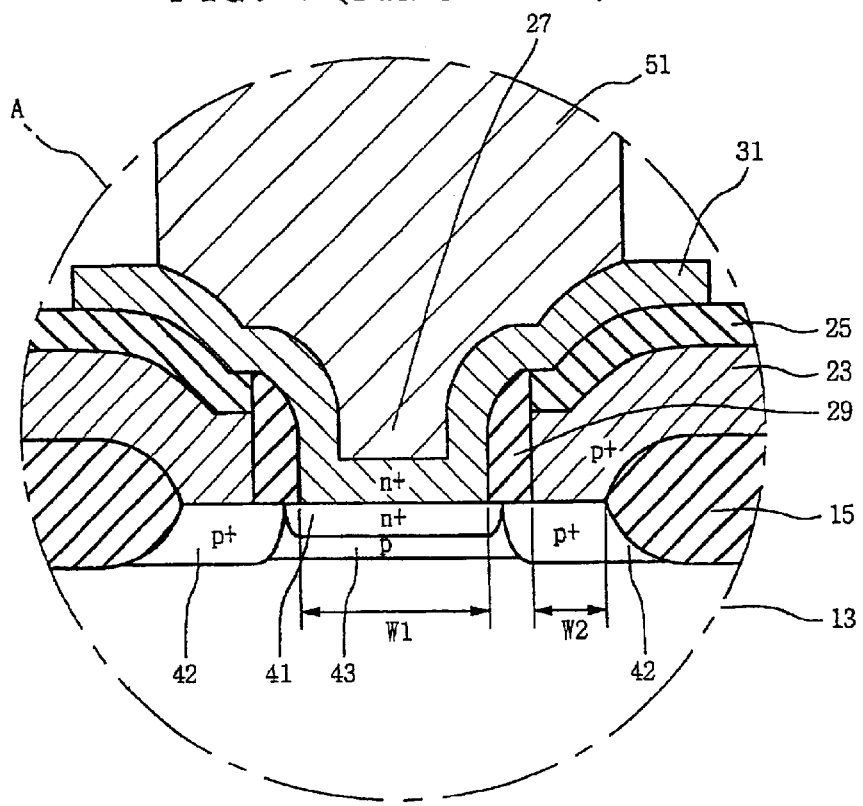
FIG. 2 is an enlarged cross-sectional view of region A highlighted in FIG. 1.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. However, when a layer or region is described as being "directly on" another layer or region, no intervening layers or regions are present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 4:
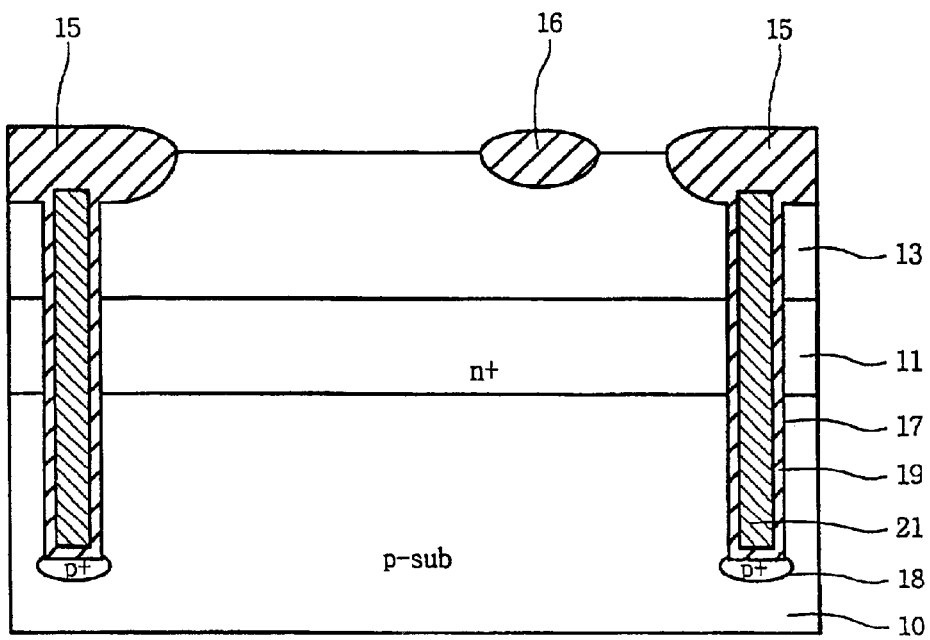
FIGS. 4–13 are cross-sectional views of intermediate structures that illustrate preferred methods of forming the integrated circuit bipolar junction transistor of FIG. 3.

Referring now to FIGS. 4–13, preferred methods of forming integrated circuit bipolar junction transistors according to the present invention will be described. In particular, FIG. 4 illustrates the steps of providing a semiconductor substrate 10 having a relatively highly doped buried layer 11 of first conductivity type (e.g., N-type) thereon. As illustrated, the semiconductor substrate 10 may comprise a second conductivity type substrate (P-sub), however, as will be understood by those skilled in the art, the buried layer 11 may be provided in a second conductivity type (e.g., P-type) well region within an N-type substrate or wafer. Using conventional techniques, an epitaxial layer 13 of first conductivity type may also be provided on the buried layer 11. As described more fully hereinbelow, the doping concentration within the epitaxial layer 13 is preferably set at a level to provide excellent intrinsic collector characteristics in the resulting bipolar junction transistor. The doping concentration within the buried layer 11 is also preferably set at a level to provide excellent extrinsic collector characteristics (e.g., low resistance) since the buried layer 11 will act as an extrinsic collector region.

Conventional field oxide isolation techniques are then performed to define a plurality of field oxide isolation regions 15 and 16 in the epitaxial layer 13. Such techniques may include self-aligned planar oxidation technology (SPOT), for example. A composite electrically insulating layer (not shown) is then formed on the epitaxial layer 13 and on the field oxide isolation regions 15 and 16. The composite electrically insulating layer may comprise an underlying pad oxide layer that is formed directly on the exposed upper surface of the epitaxial layer 13, an intermediate nitride layer on the pad oxide layer and an upper oxide layer on the intermediate nitride layer. The upper oxide layer may be formed using such techniques as plasma enhanced chemical vapor deposition (PECVD), for example. A photoresist mask may then be patterned on the upper oxide layer using conventional photolithography steps. Next, an etching step may be performed to etch through the composite electrically insulating layer and the underlying field oxide isolation region 15. This etching step may result in the exposure of a portion of the epitaxial layer 13 extending underneath the field oxide isolation region 15. The composite electrically insulating layer is then used as an etching mask during the step of etching a deep isolation trench 17. As illustrated, this deep isolation trench 17 may extend through the epitaxial layer 13 and the buried layer 11 and into the underlying substrate 10. As will be understood by those skilled in the art, the isolation trenches 17 illustrated in cross-section on the left and right sides of FIG. 4 may comprise a single ring-shaped trench or separate stripe-shaped trenches that extend in a third dimension (not shown), for example.

Referring still to FIG. 4, relatively highly doped channel-stop regions 18 of second conductivity type (e.g., P+) are then formed adjacent the bottoms of the isolation trenches 17. These channel-stop regions 18 may be formed using conventional ion implantation techniques. An electrically insulating layer 19 (e.g., thermal oxide layer) is then formed on sidewalls of the isolation trenches 17, as illustrated. The electrically insulating layer 19 may also comprise a composite of a thermal oxide layer and a nitride layer, for example. The isolation trenches 17 are then preferably filled with undoped polysilicon regions 21 that act as field rings. A thermal oxidation step may then be performed to oxidize upper portions of the polysilicon regions 21 which fill the etched openings in the field oxide isolation region 15. Remaining portions of the composite electrically insulating layer (not shown) may then be removed from the surface of the epitaxial layer 13, using conventional etching techniques. Alternatively, the underlying pad oxide layer within the composite electrically insulating layer may not be removed.

Figure 5:
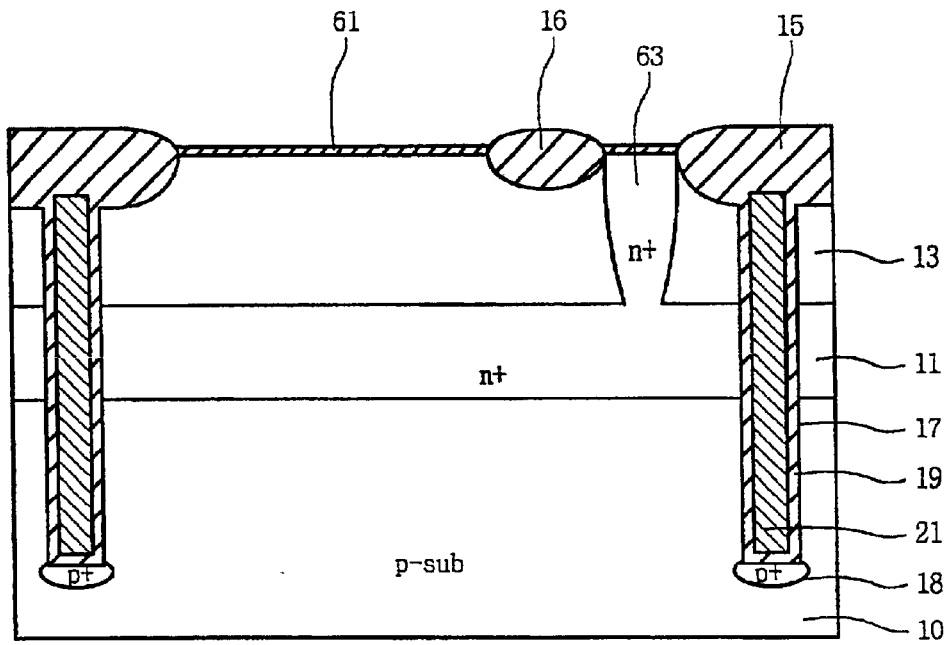

Referring now to FIG. 5, a thermal oxide layer 61 may then be formed on the epitaxial layer 13, as illustrated. A relatively highly doped collector contact region 63 of first conductivity type (e.g., N+) may then be formed in the epitaxial layer 13. In particular, a photolithographically defined mask (not shown) may be formed on the field oxide isolation regions 15 and 16 and on the thermal oxide layer 61, and then first conductivity type dopants may be selectively implanted into the epitaxial layer at a high dose and energy level. A thermal treatment step may then be performed to drive-in and diffuse the implanted dopants within the epitaxial layer 13 and define the collector contact region 63 which forms a non-rectifying junction with the buried layer 11 of first conductivity type.

Figure 6:
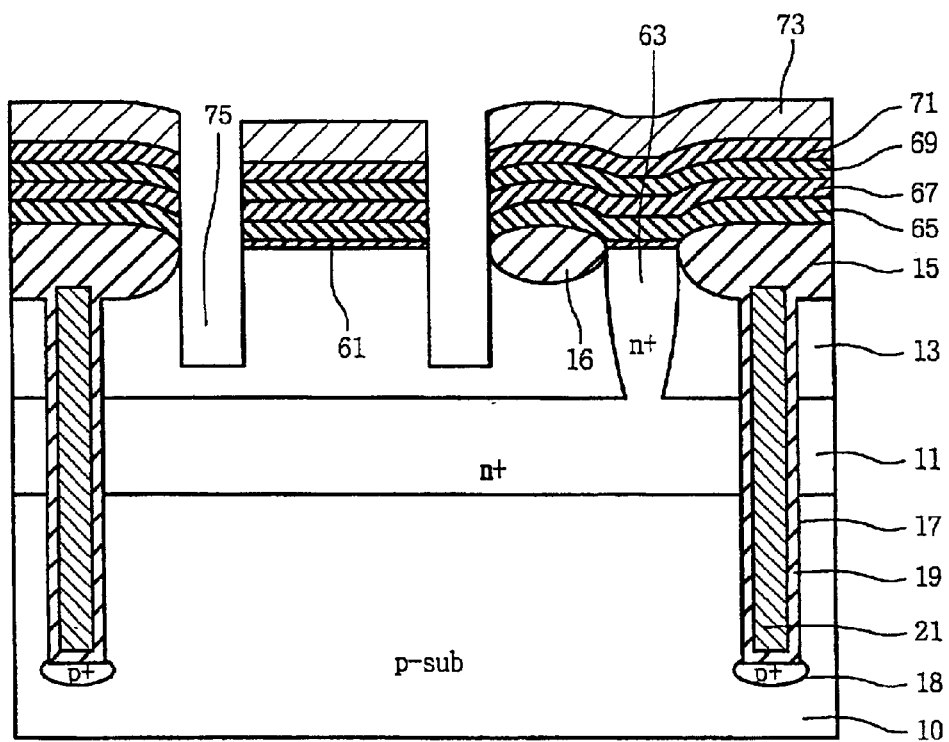

Referring now to FIG. 6, a second composite electrically insulating layer is then formed on the structure of FIG. 5, as illustrated. As illustrated, this second composite electrically insulating layer may comprise a nitride-oxide-nitride-oxide (NONO) composite including a first nitride layer 65, a first oxide layer 67, a second nitride layer 69 and a second oxide layer 71. Alternatively, the second composite electrically insulating layer may comprise an oxide-nitride-oxide-nitride (ONON) composite. As will be understood by those skilled in the art, the nitride and oxide layers preferably have different etching selectivities that, as described more fully hereinbelow, can be advantageously utilized to provide bipolar junction transistors having improved electrical characteristics.

A photoresist layer 73 is then formed on the second composite electrically insulating layer and patterned using conventional techniques. The second composite electrically insulating layer and thermal oxide layer 61 are then sequentially etched to expose the epitaxial layer 13. The epitaxial layer 13 is then etched selectively to define a plurality of trenches 75, when viewed in transverse cross-section. As will be understood by those skilled in the art, the plurality of trenches 75 may be located at opposing sides of a continuous ring-shaped trench. The duration of the step to etch the epitaxial layer 13 is preferably chosen so that the buried layer 11 is not exposed.

Figure 7:
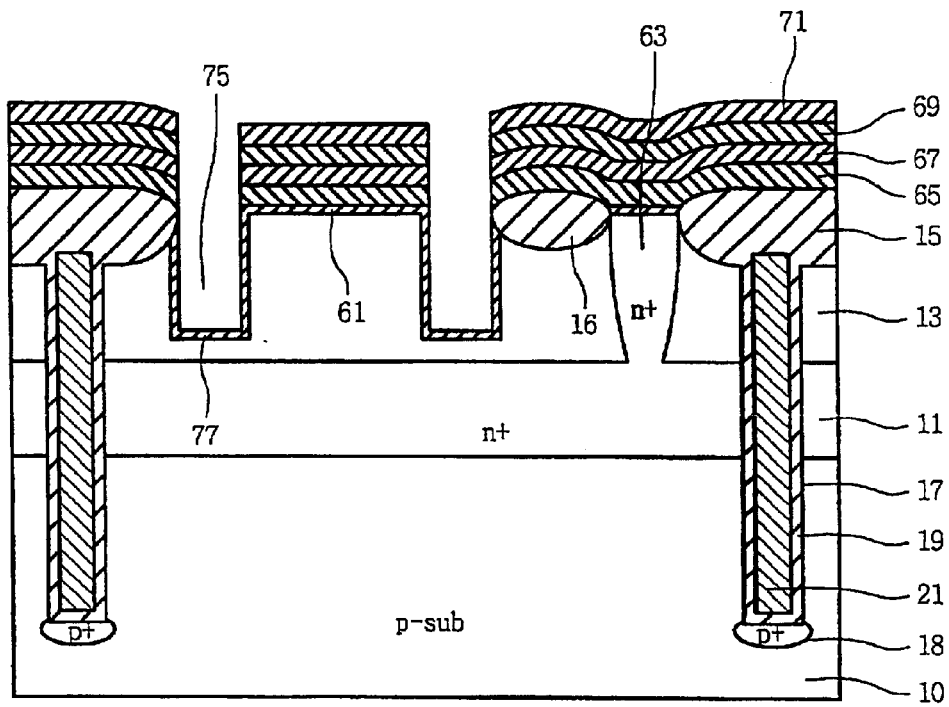
Figure 8:
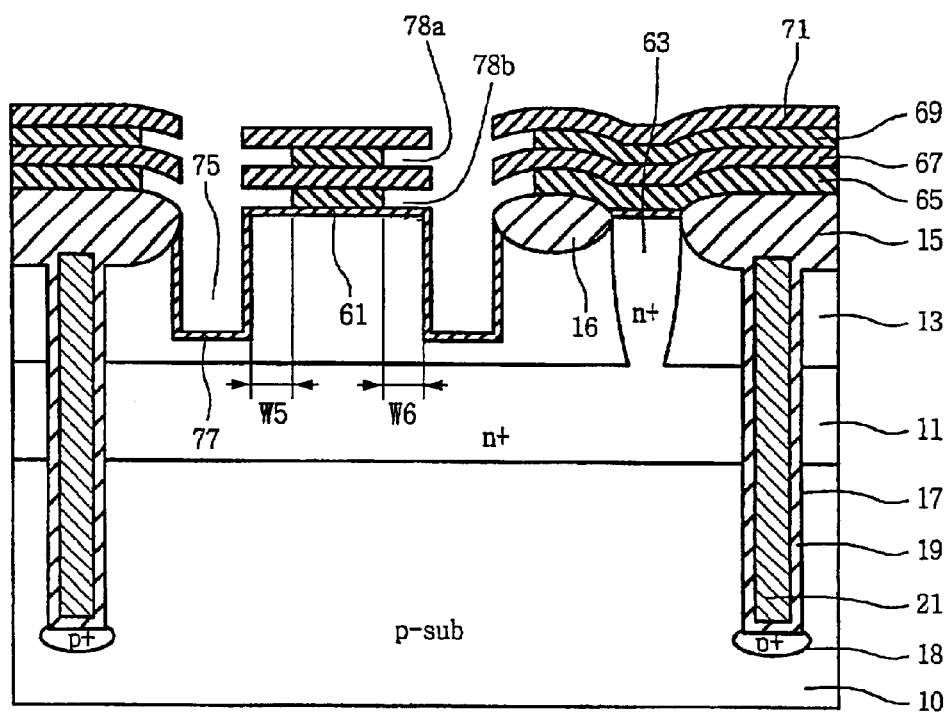

Referring now to FIG. 7, the patterned photoresist layer 73 is removed and then an oxide layer 77 is formed on sidewalls and bottoms of the trenches 75. This oxide layer 77 may comprise a thermal oxide layer in order to remove etching damage to the sidewalls and bottoms of the trenches. Alternatively, the oxide layer 77 may be deposited using such techniques as chemical vapor deposition (CVD). As illustrated by FIG. 8, a carefully controlled wet etching step may then be performed to laterally etch the nitride layers 65 and 69 within the second composite electrically insulating layer, in a selective manner. Alternatively, the oxide layers may be selectively etched in the event the second composite electrically insulating layer comprises an ONON composite instead of an NONO composite.

Because of the high degree of etching selectivity that can be achieved between oxide and nitride layers using conventional etchants, lateral recesses 78a and 78b may be formed when exposed sidewalls of the nitride layers 65 and 69 are etched at a relatively high rate relative to the rate at which the exposed oxide layers and regions 71, 67, 15, 16 and 77 are etched. These lateral recesses may have widths W5 and W6, as illustrated, where W5 equals W6. As described more fully hereinbelow, the lateral dimensions of these recesses will influence the sizes of the subsequently formed extrinsic base region and emitter region. In other words, the duration of the wet etching step and the etching characteristics (composition, thickness, etc.) of the nitride layers 65 and 69 being etched with a particular etchant can be used to carefully control the lateral dimensions of the extrinsic base region and emitter region (and also achieve symmetry). Such lateral dimension control may be more accurate than that achievable with direct photolithographically defined masking and patterning steps. In other words, highly precise and expensive photolithography techniques may not be absolutely necessary when using the techniques of the present invention. Moreover, bipolar transistors having more highly integrated base and emitter regions can be achieved using the preferred self-aligned lateral etching techniques.

Figure 9:
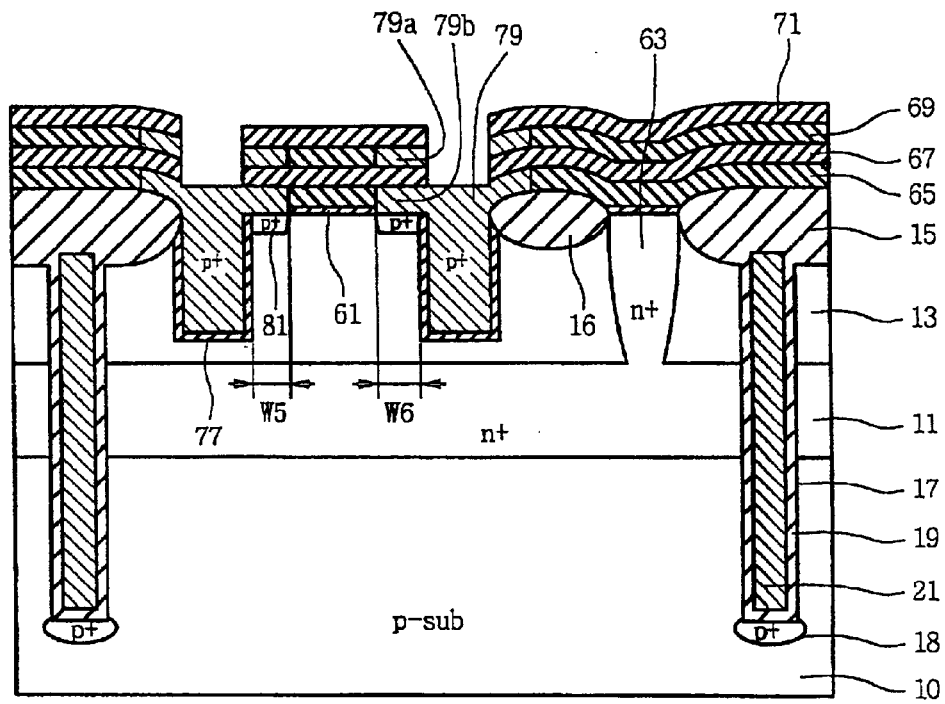
Figure 10:
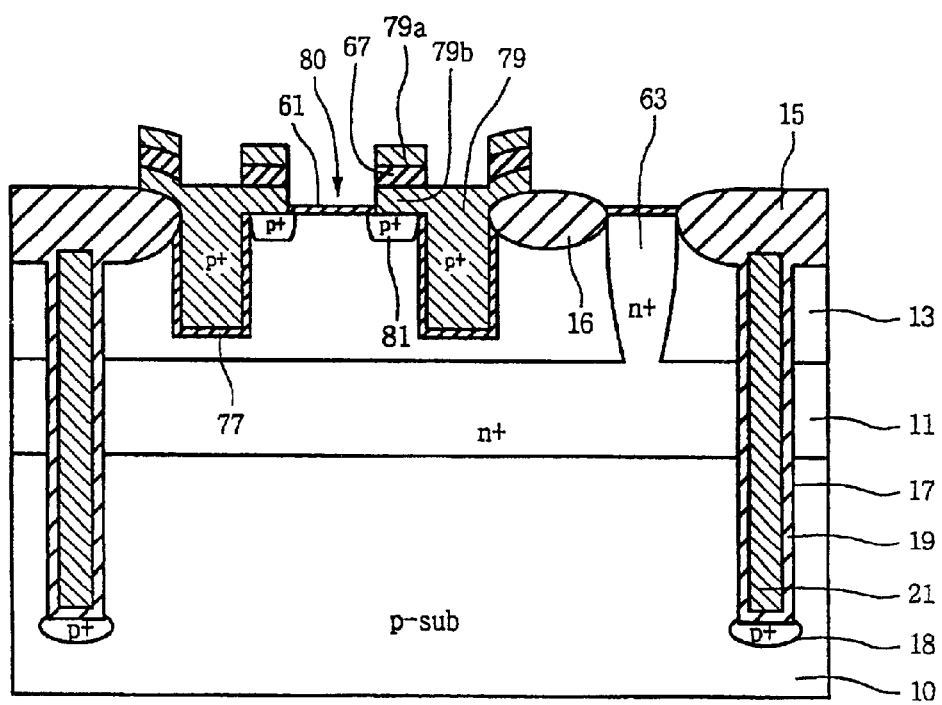

Referring now to FIG. 9, a relatively short duration oxide etching step may then be performed to selectively remove exposed portions of the thermal oxide layer 61 within the recesses and expose portions of the epitaxial layer 13. A relatively highly doped blanket polysilicon layer of second conductivity type may then be deposited to fill the trenches 75 and the lateral recesses 78a and 78b. A thermal treatment step may then be performed to diffuse second conductivity type dopants from the polysilicon layer into the epitaxial layer 13 to define a self-aligned and highly doped extrinsic base region 81 therein. Although illustrated as separate regions, this extrinsic base region 81 may be a single continuous ring-shaped region. A conventional etch-back step may then be performed on the blanket polysilicon layer to define a trench-based polysilicon base electrode 79 having lateral base electrode extensions 79b that contact the extrinsic base region 81. During this etch-back step, polysilicon inserts 79a may also be defined. As illustrated, these inserts 79a are electrically disconnected from the trench-based polysilicon base electrode 79. Then, as illustrated by FIG. 10, the second oxide layer 71 is selectively etched to expose the second nitride layer 69 and then another selective etching step is performed to etch the second nitride layer 69 but not the polysilicon inserts 79a. This latter etching step results in the exposure of the first oxide layer 67. The first oxide layer 67 is then anisotropically etched using the polysilicon inserts 79a as an etching mask. The first nitride layer 65 is then dry-etched or isotropically etched to expose the thermal oxide layer 61 in the opening 80 defined by sidewalls of the remaining portions of the first oxide layer 67 and polysilicon inserts 79a. Although less preferred, the first nitride layer 65 may also be etched after patterning a photolithographically defined etching mask (not shown).

Figure 11:
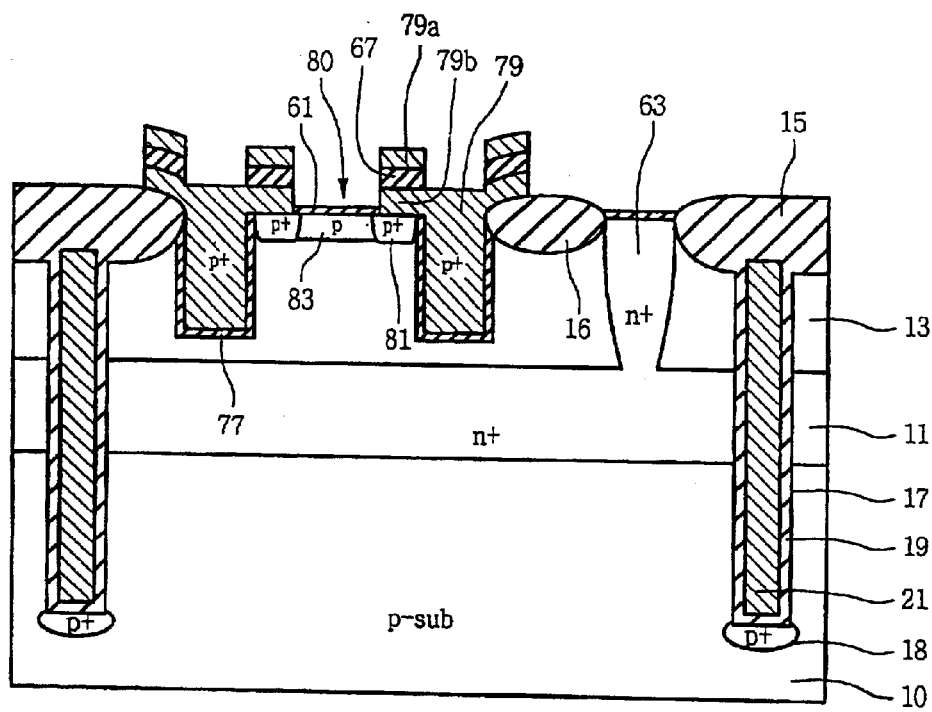
Figure 12:
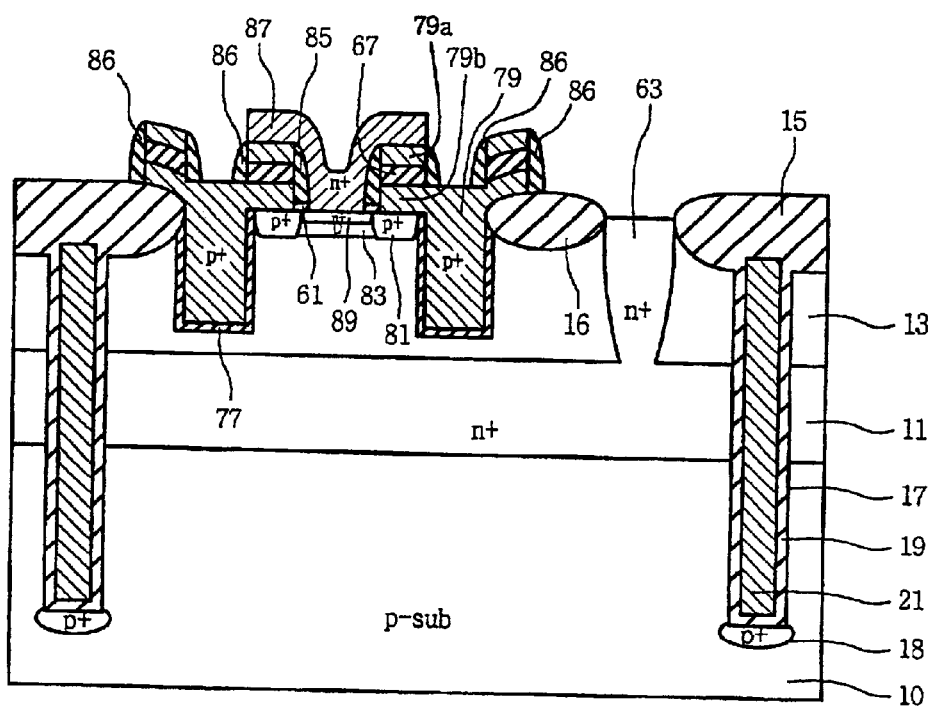

Referring now to FIG. 11, a self-aligned intrinsic base region 83 is formed by implanting second conductivity type dopants (e.g., boron) through the opening 80 (and thermal oxide layer) and into the epitaxial layer 13. A subsequent thermal treatment step (e.g., annealing) may then be performed to drive-in and diffuse the implanted base region dopants so that a non-rectifying junction is formed between the intrinsic base region 83 and the extrinsic base region 81. A blanket electrically insulating layer is then deposited on the structure of FIG. 11. As illustrated by FIG. 12, this blanket electrically insulating layer is then etched-back using an anisotropic reactive ion etching process, for example, to define a plurality of electrically insulating sidewall spacers 85 and 86. In particular, an electrically insulating sidewall spacer 85 is formed in the opening 80 and on a sidewall of the trench-based polysilicon base electrode 79, a sidewall of the first oxide layer 67 and on a sidewall of the polysilicon insert 79a. The thermal oxide layer 61 may then be etched to expose the intrinsic base region 83. A highly doped polysilicon layer of first conductivity type (e.g., N+) is then deposited and patterned to define an emitter electrode 87. As illustrated, the emitter electrode 87 may electrically contact and cover upper surfaces of the polysilicon inserts 79a.

Figure 3:
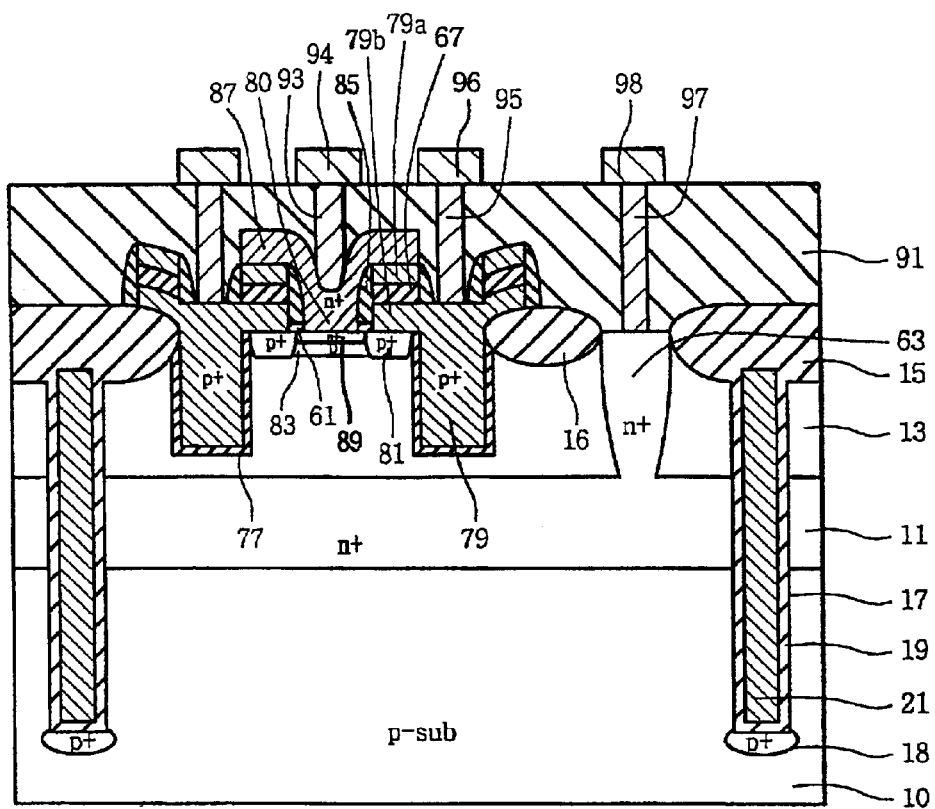
FIG. 3 is a cross-sectional view of an integrated circuit bipolar junction transistor according to a first embodiment of the present invention.
Figure 13:
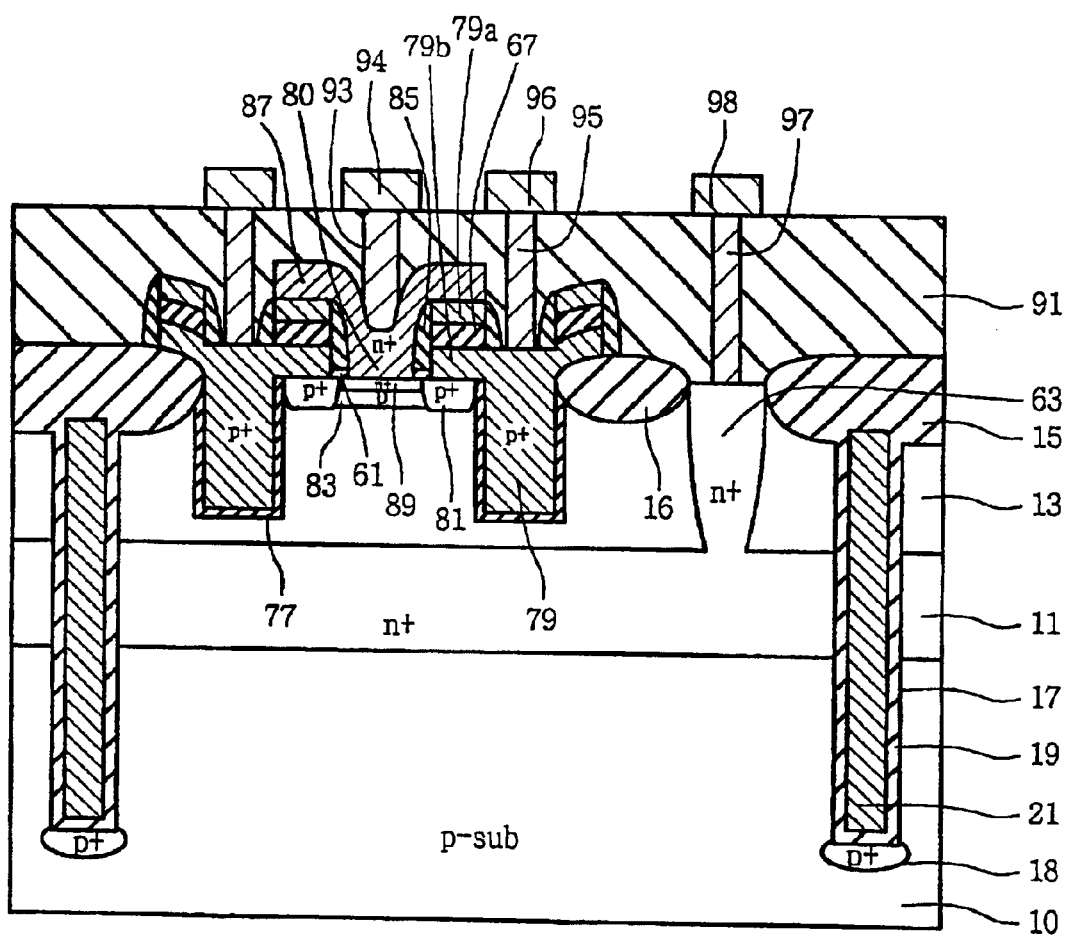

A thermal treatment step may then be performed so that first conductivity type dopants (e.g., As, Sb, P) within the emitter electrode 87 diffuse into the intrinsic base region 83 and define a highly doped self-aligned emitter region 89 therein, as illustrated. Referring now to FIGS. 3 and 13, an electrically insulating passivation layer 91 is then deposited onto the structure of FIG. 12 using conventional techniques. Contact holes are then formed in the passivation layer 91 to expose the polysilicon base electrode 79, the polysilicon emitter electrode 87, and the collector contact region 63. Conductive plugs 93, 95 and 97 which comprise a material such as tungsten, are then formed in the contact holes, as illustrated. A blanket layer of metallization may then be deposited and patterned to define an emitter wiring pattern 94, a base wiring pattern 96 and a collector wiring pattern 98.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A bipolar junction transistor, comprising:
   an intrinsic collector region of first conductivity type in a semiconductor substrate;
   a trench in said substrate, adjacent said intrinsic collector region;
   a base electrode of second conductivity type in the semiconductor substrate, said base electrode comprising a trench-based electrode portion that extends in said trench and a lateral base electrode extension that extends outside said trench;
   an extrinsic base region of second conductivity type that is self-aligned and electrically connected to said lateral base electrode extension and forms a P-N rectifying junction with said intrinsic collector region;
   an intrinsic base region of second conductivity type that is self-aligned to said lateral base electrode extension, has a lower second conductivity type doping concentration therein relative to said extrinsic base region and forms a P-N rectifying junction with said intrinsic collector region;
   a trench insulating layer that lines a bottom and sidewalls of said trench and prevents direct electrical contact between the trench-based electrode portion of said base electrode and said extrinsic base region by blocking charge transfer across the sidewalls of said trench; and
   an emitter region of first conductivity type that forms a P-N rectifying junction with said intrinsic base region.

2. The transistor of claim 1, wherein said emitter region is self-aligned to a sidewall of the lateral base electrode extension.

3. The transistor of claim 1, wherein said trench is ring-shaped; and wherein said extrinsic base region is ring-shaped.

4. The transistor of claim 2, further comprising:
   an electrically insulating sidewall spacer on the sidewall of the lateral base electrode extension; and
   an emitter electrode of first conductivity type on the surface of said substrate and on said electrically insulating sidewall spacer.

5. The transistor of claim 4, further comprising a buried extrinsic collector region of first conductivity type in said substrate, said buried extrinsic collector region forming a non-rectifying junction with said intrinsic collector region.

6. The transistor of claim 5, wherein an inner sidewall of said trench defines an intrinsic collector region mesa that extends between said buried extrinsic collector region and the surface of said substrate.

7. A bipolar junction transistor, comprising:
   an electrically insulating layer on a surface of a semiconductor substrate having an intrinsic collector region of first conductivity type therein, said electrically insulating layer comprising a composite of a first electrically insulating material layer and a second electrically insulating material layer on the first electrically insulating material layer and having a lateral recess therein that extends along an undersurface of the second electrically insulating material layer;

a trench that extends into the surface of the semiconductor substrate and into the intrinsic collector region and is self-aligned to an opening in said electrically insulating layer;

a base electrode of second conductivity type having a first portion that extends in said trench and a second portion that extends into the lateral recess within said electrically insulating layer;

a base region of second conductivity type that is self-aligned and electrically connected to the second portion of said base electrode extending into the lateral recess and forms a P-N rectifying junction with said intrinsic collector region;

a trench insulating layer that lines a bottom and sidewalls of said trench and extends between the first portion of said base electrode and said base region so that any charge transfer across the sidewalls of said trench from the first portion of said base electrode to said base region is blocked; and an emitter region of first conductivity type that forms a P-N rectifying junction with said base region.

* * * * *